United States Patent [19]

Asada

[11] Patent Number: 5,216,685
[45] Date of Patent: Jun. 1, 1993

[54] SEMICONDUCTOR LIGHT EMITTING DEVICE WITH LUMINESCENT LAYER SANDWICHED BETWEEN QUARTER WAVELENGTH DISTRIBUTED BRAGG REFLECTORS

[75] Inventor: Susumu Asada, Tokyo, Japan

[73] Assignee: NEC Corporation, Tokyo, Japan

[21] Appl. No.: 823,292

[22] Filed: Jan. 21, 1992

[30] Foreign Application Priority Data

Jan. 28, 1991 [JP] Japan ................................. 3-8182

[51] Int. Cl.$^5$ ............................................... H01S 3/19
[52] U.S. Cl. ........................................ 372/45; 372/96; 372/99
[58] Field of Search ...................... 372/45, 50, 92, 96, 372/99

[56] References Cited

U.S. PATENT DOCUMENTS 5,052,016  9/1991  Mahbobzadeh et al. ............. 372/96
5,068,868  11/1991  Deppe et al. ......................... 372/46

Primary Examiner—James W. Davie
Attorney, Agent, or Firm—Laff, Whitesel, Conte & Saret

[57] ABSTRACT

A surface emitting laser device has a luminescent layer, a lower distributed Bragg reflector formed below the luminescent layer and an upper distributed Bragg reflector formed over the luminescent layer, and each of the lower and upper distributed Bragg reflectors comprises a high refractive film of gallium arsenide with the minimum forbidden band width at gamma point, an intermediate film of aluminum gallium arsenide and a low refractive film of aluminum gallium arsenide with the minimum forbidden band width outside the gamma point, wherein the aluminum gallium arsenide for the intermediate film has a predetermined forbidden band width, and the forbidden band gap between the high refractive film and the intermediate film is approximately equal to the forbidden band gap between the intermediate film and the low refractive film so that the series resistance of the surface emitting laser device is drastically reduced.

8 Claims, 3 Drawing Sheets

SEMICONDUCTOR LIGHT EMITTING DEVICE WITH LUMINESCENT LAYER SANDWICHED BETWEEN QUARTER WAVELENGTH DISTRIBUTED BRAGG REFLECTORS

FIELD OF THE INVENTION

This invention relates to a semiconductor light emitting device and, more particularly, to a surface emitting laser device with luminescent layer sandwiched between quarter wavelength distributed Bragg reflectors.

DESCRIPTION OF THE RELATED ART

A surface emitting laser device is an important system component of an optical communication system as well as of an optical information processing system, and various structures of the surface emitting laser device have been proposed. The surface emitting laser device is attractive because of the small size as well as of potential of integration. A surface emitting laser device has a multi-level structure of semiconductor films with different forbidden band widths is attractive, and the development of epitaxial technology allows the multi-level structure to have abrupt heterojunctions. The abrupt heterojunctions form an optical cavity, and the optical cavity confines carriers in a luminescent layer. this results in high-efficiency light generation. However, if current-carrying structures sandwiching the luminescent layer have large differences in the forbidden band width, large potential gaps take place at the heterojunctions, and the potential gaps at the heterojunctions develop carrier-depletion layers. This results in large series resistance of the surface laser device. If the series resistance is too large, the series resistance gives rise to increase the heat generation, and the heat generation deteriorates the properties of the laminated semiconductor films such as the luminescent efficiency.

One of the solution for reducing the series resistance is disclosed by K. Tai et. al. in "Drastic reduction of series resistance in doped semiconductor distributed Bragg reflectors for surface-emitting lasers", Applied Physics Letters, 56(25), Jun. 18, 1990, pages 2496 to 2498. Tai et. al. proposes to insert an intermediate $Al_{0.35}Ga_{0.65}As$ layer or a 200 angstrom superlattice of GaAs (10 angstroms)/ $Al_{0.7}Ga_{0.3}As$ (10 angstroms) at GaAs/ $Al_{0.7}Ga_{0.3}As$ heterointerfaces of quarter-wavelength distributed Bragg reflectors.

However, the series resistance of the surface emitting laser device is still large, and an improvement has been expected.

SUMMARY OF THE INVENTION

It is therefore an important object of the present invention provide a semiconductor light emitting device which is further improved in series resistance and achieves an excellent luminescent efficiency.

To accomplish the object, the present invention proposes to select a compound semiconductor material of the intermediate film in such a manner that difference in the forbidden band width between a high refractive film and the intermediate film is approximately equal to difference in the forbidden band width between the intermediate film and a low refractive film.

In accordance with the present invention, there is provided a semiconductor light emitting device comprising a) a lower distributed Bragg reflector having a plurality of laminations each implemented by a high refractive film of a first compound semiconductor material, an intermediate film of a second compound semiconductor material and a low refractive film of a third compound semiconductor material, said first compound semiconductor material having a forbidden band with the minimum band width at the gamma point, said third compound semiconductor material having a forbidden band with the minimum band width outside said gamma point, difference in the forbidden band width between said first and second compound semiconductor materials being approximately equal to difference in the forbidden band between said second and third compound semiconductor materials, b) a luminescent layer of a fourth compound semiconductor material sandwiched between upper and lower guide layers of fifth compound semiconductor material, c) an upper distributed Bragg reflector having a plurality of laminations each implemented by a high refractive film of a sixth compound semiconductor material, an intermediate film of a seventh compound semiconductor material and a low refractive film of an eighth compound semiconductor material, said sixth compound semiconductor material having a forbidden band with the minimum band width at said gamma point, said eighth compound semiconductor material having a forbidden band with the minimum band width outside said gamma point, difference in the forbidden band width between said sixth and seventh compound semiconductor materials being approximately equal to difference in the forbidden band width between said seventh and eighth compound semiconductor materials, d) a first electrode held in contact with said high refractive film of said lower distributed Bragg reflector, and e) a second electrode held in contact with said high refractive film of said upper distributed Bragg reflector.

BRIEF DESCRIPTION OF THE DRAWINGS

The feature and advantages of the semiconductor light emitting device according to the present invention will be more clearly understood from the following description taken in conjunction with the accompanying drawings in which.

DESCRIPTION OF THE PREFERRED EMBODIMENTS

First Embodiment

Figure 1:
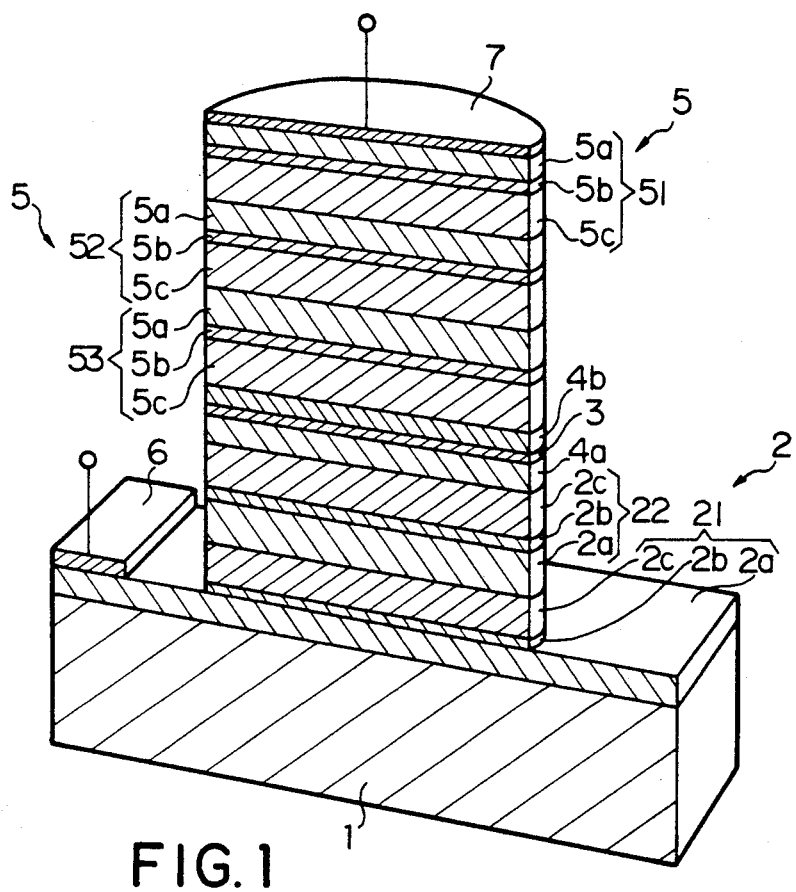
FIG. 1 is a partially cut-away perspective view showing the structure of a semiconductor light emitting device according to the present invention.

Referring first to FIG. 1 of the drawings, a surface emitting laser device embodying the present invention is fabricated on a semi-insulating gallium arsenide substrate 1. The surface emitting laser device comprises a lower distributed Bragg reflector 2, a luminescent layer 3 of intentionally undoped indium gallium arsenide sandwiched between lower and upper guide layers 4a and 4b of aluminum gallium arsenide, and an upper distributed Bragg reflector 5 stacked over the semi-insulating gallium arsenide substrate 1, and each of the lower and upper distributed Bragg reflectors 2 and 5 has a multi-level structure formed by compound semiconductor films epitaxially grown.

In detail, the lower distributed Bragg reflector 2 comprises two laminations 21 and 22, and each of the laminations 21 and 22 is regulated in such a manner as to have thickness approximately equal to a quarter of the wavelength of light produced in the luminescent layer 3. Each of the laminations 21 and 22 is implemented by a high refractive film 2a of n-type gallium arsenide with the minimum forbidden band width at gamma point, an intermediate film 2b of n-type aluminum gallium arsenide expressed as $Al_xGa_{1-x}As$ and a low refractive film 2c of n-type aluminum gallium arsenide with the minimum forbidden band width outside gamma point expressed as $Al_yGa_{1-y}As$. In this instance, the high refractive film 2a is about 695 angstroms in thickness, the intermediate film 2b is about 50 angstroms in thickness, and the low refractive film 2c is about 770 angstroms in thickness. Since laser produced in the luminescent layer 3 has the wavelength of about 9800 angstroms, the thickness of the lamination 21 or 22 is about a quarter of the wavelength.

The upper distributed Bragg reflector 5 comprises three laminations 51, 52 and 53, and each of the laminations 51 to 53 is also regulated in such a manner as to have thickness approximately equal to a quarter of the wavelength of light produced in the luminescent layer 3. Each of the laminations 51 to 53 is implemented by a high refractive film 5a of p-type gallium arsenide with the minimum forbidden band width at gamma point, an intermediate film 5b of p-type aluminum gallium arsenide expressed as $Al_xGa_{1-x}As$ and a low refractive film 5c of p-type aluminum gallium arsenide with the minimum forbidden band width outside gamma point expressed as $Al_yGa_{1-y}As$. In this instance, the high refractive film 5a is about 695 angstroms in thickness, the intermediate film 5b is about 50 angstroms in thickness, and the low refractive film 5c is about 770 angstroms in thickness. The total thickness of the lamination 51, 52 or 52 is also about a quarter of the wavelength.

The high refractive film 2a of the lamination 21 is partially exposed, and an electrode 6 is held in contact with the exposed surface of the high refractive film 2a. Another electrode 7 is held in contact with the top surface of the high refractive film 5a incorporated in the lamination 51, and an appropriate bias is applied between the electrodes 6 and 7 for generating laser.

Figure 2:
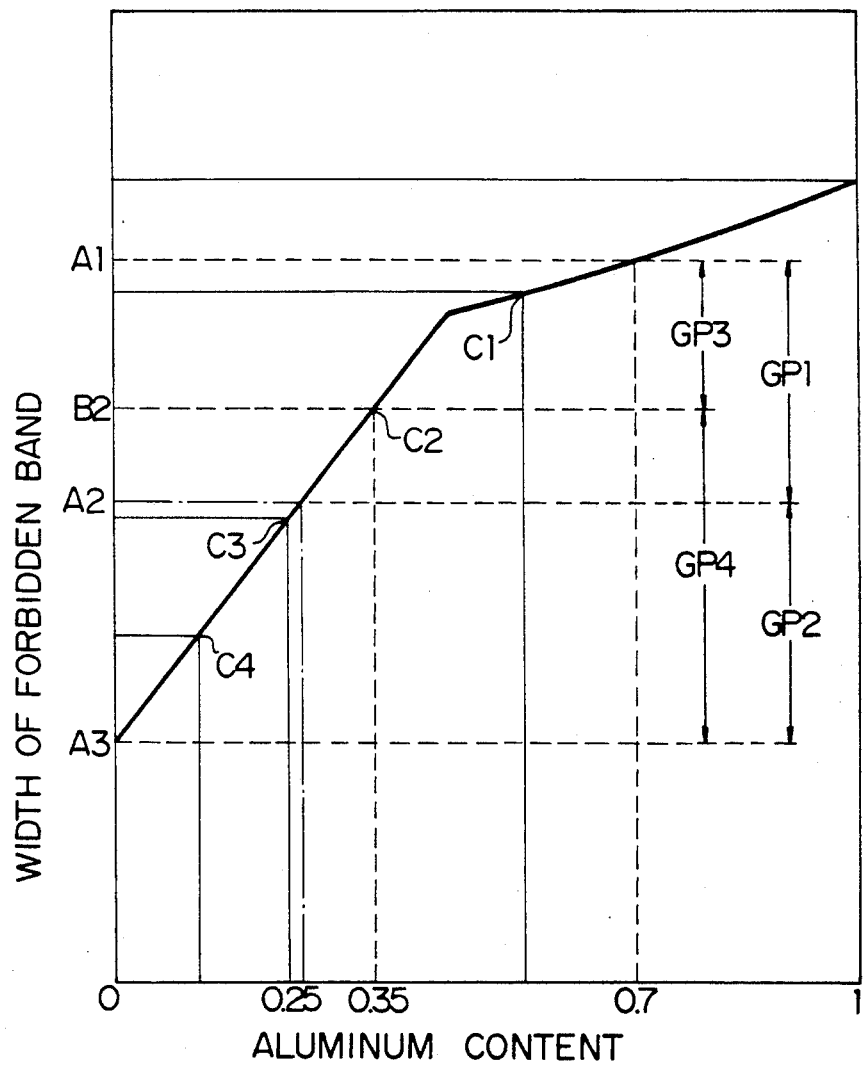
FIG. 2 is a graph showing the relationship between the forbidden band width and aluminum content of aluminum gallium arsenide.

In this instance, Y of the aluminum gallium arsenide expressed as $Al_yGa_{1-y}As$ is adjusted to 0.7 as similar to that of the prior art surface emitting laser device proposed by Tai et. al. However, it is adjusted to 0.25 according to the present invention. FIG. 2 shows the forbidden band gap of aluminum gallium arsenide in terms of the aluminum content. The aluminum gallium arsenide expressed as $Al_{0.7}Ga_{0.3}As$ has the forbidden width at point A1, and the forbidden band width of the aluminum gallium arsenide expressed as $Al_{0.25}Ga_{0.75}As$ is defined at point A2. Since gallium arsenide has the forbidden band width at point A3, difference GP1 in the forbidden band width between $Al_{0.7}Ga_{0.3}As$ and $Al_{0.25}Ga_{0.75}As$ is approximately equal to difference GP2 between $Al_{0.25}Ga_{0.75}As$ and GaAs.

For better understanding of the present invention, let us plot the forbidden band widths of the prior art surface emitting laser device proposed by Tai et. al. The low refractive film is identical with that of the present invention. However, the intermediate film of Tai's device is formed of $Al_{0.35}Ga_{0.65}As$, and the forbidden band width is plotted at point B2, and difference GP3 in the forbidden band width between $Al_{0.7}Ga_{0.3}As$ and $Al_{0.35}Ga_{0.65}As$ is much smaller than difference GP4 between $Al_{0.35}Ga_{0.65}As$ and GaAs.

The equalized differences GP1 and GP2 are effective against the series resistance of the surface emitting laser device. If the differences GP3 and GP4 is unbalanced, one of the differences GP4 is so large that a large amount of carrier is accumulated in the depletion layer produced at the heterojunction of the difference GP4. However, the equalized differences GP1 and GP2 is free from the large amount of carrier accumulation, and the series resistance is surely decreased. The present inventor evaluated the series resistance of the surface emitting laser device shown in FIG. 1 in comparison with Tai's surface emitting laser device. Tai's laser device was as large in series resistance as $6 \times 10^{-5}$ ohm $-$ cm$^2$. However, the surface emitting laser device shown in FIG. 1 achieved low series resistance about a half of the series resistance of Tai's laser device.

Second Embodiment

Figure 3:
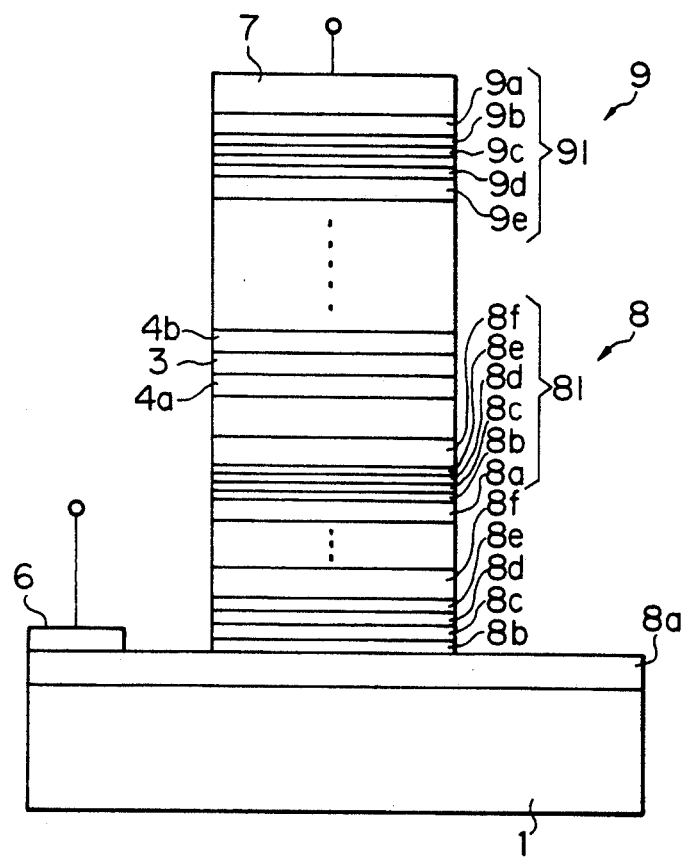
FIG. 3 is a front view showing the structure of another semiconductor light emitting device according to the present invention.

Turning to FIG. 3 of the drawings, another surface emitting laser device embodying the present invention is fabricated on a semi-insulating gallium arsenide substrate 1, and largely comprises a lower distributed Bragg reflector 8, a luminescent layer 3 of intentionally undoped indium gallium arsenide sandwiched between lower and upper guide layers 4a and 4b of aluminum gallium arsenide, and an upper distributed Bragg reflector 9 stacked over the semi-insulating gallium arsenide substrate 1, and each of the lower and upper distributed Bragg reflectors 2 and 5 has a multi-level structure formed by compound semiconductor films epitaxially grown.

The lower distributed Bragg reflector 8 is implemented by a plurality of laminations including a lamination 81, and the upper distributed Bragg reflector 9 is also implemented by a plurality of laminations including a lamination 91. The lamination 81 comprises a high refractive film 8a of n-type gallium arsenide, a multi-level intermediate film structure consisting of n-type aluminum gallium arsenide films 8b, 8c, 8d and 8e, and a low refractive film 8f of n-type aluminum arsenide Similarly, the lamination 91 comprises a high refractive film 9a of p-type gallium arsenide, a multi-level intermediate film structure consisting of p-type aluminum gallium arsenide films 9b, 9c, 9d and 9e, and a low refractive film 9f of p-type aluminum arsenide. The component aluminum gallium arsenide films 8b to 8e or 9b to 9e are selected in such a manner as to difference in the forbidden band width between every adjacent two compound semiconductor materials is approximately equal to one another. Namely, the aluminum contents of the aluminum gallium arsenide films 8b to 8e or 9b to 9e are respectively plotted at C1, C2, C3 and C4 in FIG. 2. The multi-level intermediate film structures 81 and 91 effectively decrease the series resistance in comparison with no multi-level intermediate film structures. When the low refractive films 8f and 9f are formed of aluminum arsenide, the refractive indexes of the lower and upper distributed Bragg reflectors 8 and 9 are increased. Therefore the very low threshold current is achieved.

Although particular embodiments of the present invention have been shown and described, it will be obvious to those skilled in the art that various changes and modifications may be made without departing from the spirit and scope of the present invention. For example, an intermediate film structure may have a super-lattice structure where a compound semiconductor film with a wide forbidden band and a compound semiconductor film with a narrow forbidden band are laminated by changing the thicknesses thereof.

Moreover, the present invention may be applied to a semiconductor light emitting device in a combination of a compound semiconductor material selected from GaAs, InP and InGaAsP and another compound semiconductor material selected from AlGaAs and AlGaInP.

What is claimed is:

1. A semiconductor light emitting device comprising
a) a lower distributed Bragg reflector having a plurality of laminatins, each of said lamiations being implemented by a highly refractive film of a fist compound semiconductor material, an intermediate film of a second compound semiconductor material and a low refractive film of a third compound semiconductor material, said first compound semiconductor material having a forbidden band with the minimum band width at the gamma point, said third compound semiconductor material having a forbidden band with the minimum band width outside the gamma point, the difference in the forbidden band widths between said first and second compound semiconductor materials being approximately equal to the difference in the forbidden band between said second and third compound semiconductor materials,
b) a luminescent layer of a fourth compound semiconductor material sandwiched between upper and lower guide layers of a fifth compound semiconductor material,
c) an upper distributed Bragg reflector having a plurality of laminations, each of said laminations being implemented by a highly refractive film of a sixth compound semiconductor material, an intermediate film of a seventh compound semiconductor material and a low refractive film of an eighth compound semiconductor material, said sixth compound semiconductor material having a forbidden band with the minimum band width at the gamma point, said eighth compound semiconductor material having a forbidden band with the minimum band width outside the gamma point, the difference in the forbidden band width between said sixth and seventh compound semiconductor materials being approximately equal to the difference in the forbidden band width between said seventh and eighth compound semiconductor materials,
d) a first electrode held in contact with said highly refractive film of said lower distributed Bragg reflector, and
e) a second electrode held in contact with said highly refractive film of said upper distributed Bragg reflector.

2. A semiconductor light emitting device as set forth in claim 1, in which said semiconductor light emitting device is fabricated on a substrate of a ninth compound semiconductor material.

3. A semiconductor light emitting device as set forth in claim 2, in which said semiconductor light emitting device is of a surface emitting laser device.

4. A semiconductor light emitting device as set forth in claim 3, in which said first compound semiconductor material, said second compound semiconductor material and said third compound semiconductor material have a first conductivity type, and are expressed by the molecular formulae of GaAs, $Al_{0.25}Ga_{0.75}As$ and $Al_{0.7}Ga_{0.3}As$.

5. A semiconductor light emitting device as est forth in claim 4, in which said fourth and fifth compound of semiconductor materials are intentionally undoped indium gallium arsenide and aluminum gallium arsenide, respectively.

6. A semiconductor light emitting device as set forth in claim 5, in which said sixth compound semiconductor material, said seventh compound semiconductor material and said eighth compound semiconductor material have a second conductivity type opposite to said first conductivity type, and are expressed by the molecular formulae of GaAs, $Al_{0.25}Ga_{0.75}As$ and $Al_{0.7}Ga_{0.3}As$.

7. A semiconductor light emitting device as set forth in claim 2, in which said intermediate film of said lower distributed Bragg reflector forms a part of a multi-level intermediate film structure, component films of said multi-level intermediate film structure producing differences in forbidden band width from adjacent component films approximately equal to one another.

8. A semiconductor light emitting device as set forth in claim 7, in which said intermediate film of said upper distributed Bragg reflector forms a part of a multi-level intermediate film structure, component films of said multi-level intermediate film structure producing differences in forbidden band width from adjacent component films approximately equal to one another.

* * * * *